(12) United States Patent
Bentley et al.

(10) Patent No.: US 9,647,086 B2
(45) Date of Patent: May 9, 2017

(54) EARLY PTS WITH BUFFER FOR CHANNEL DOPING CONTROL

(71) Applicants: GLOBALFOUNDRIES Inc., Grand Cayman (KY); International Business Machines Corporations, Armonk, NY (US); STMicroelectronics, Inc., Coppell, TX (US)

(72) Inventors: Steven Bentley, Watervliet, NY (US); Jody Fronheiser, Delmar, NY (US); Xin Miao, Guilderland, NY (US); Joseph Washington, Albany, NY (US); Pierre Morin, Albany, NY (US)

(73) Assignees: GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/826,803

(22) Filed: Aug. 14, 2015

(65) Prior Publication Data
US 2017/0047425 A1    Feb. 16, 2017

(51) Int. Cl.
*H01L 29/66* (2006.01)
*H01L 29/06* (2006.01)
*H01L 21/265* (2006.01)
*H01L 21/324* (2006.01)
*H01L 21/306* (2006.01)
*H01L 21/308* (2006.01)
*H01L 21/02* (2006.01)

(52) U.S. Cl.
CPC .... *H01L 29/66537* (2013.01); *H01L 21/0245* (2013.01); *H01L 21/02532* (2013.01); *H01L 21/02538* (2013.01); *H01L 21/265* (2013.01); *H01L 21/3081* (2013.01); *H01L 21/30604* (2013.01); *H01L 21/324* (2013.01); *H01L 29/0638* (2013.01)

(58) Field of Classification Search
CPC ....... H01L 29/66; H01L 29/06; H01L 21/265; H01L 21/324; H01L 21/306; H01L 21/308; H01L 21/02
USPC .......................................... 257/345; 438/492
See application file for complete search history.

(56) References Cited

U.S. PATENT DOCUMENTS

| | | | |
|---|---|---|---|
| 9,093,477 B1 * | 7/2015 | Lin | H01L 21/26513 |
| 2003/0162348 A1 * | 8/2003 | Yeo | H01L 21/28114 438/218 |
| 2016/0049402 A1 * | 2/2016 | Liu | H01L 27/0924 257/369 |

(Continued)

FOREIGN PATENT DOCUMENTS

WO      2009053327 A1    4/2009

*Primary Examiner* — Julia Slutsker
*Assistant Examiner* — Dmitriy Yemelyanov
(74) *Attorney, Agent, or Firm* — Ditthavong & Steiner, P.C.

(57) ABSTRACT

A method of performing an early PTS implant and forming a buffer layer under a bulk or fin channel to control doping in the channel and the resulting bulk or fin device are provided. Embodiments include forming a recess in a substrate; forming a PTS layer below a bottom surface of the recess; forming a buffer layer on the bottom surface and on side surfaces of the recess; forming a channel layer on and adjacent to the buffer layer; and annealing the channel, buffer, and PTS layers.

20 Claims, 2 Drawing Sheets

(56) References Cited

U.S. PATENT DOCUMENTS

2016/0204260 A1\* 7/2016 Ching ................ H01L 29/7851
　　　　　　　　　　　　　　　　　　　　　257/401

\* cited by examiner

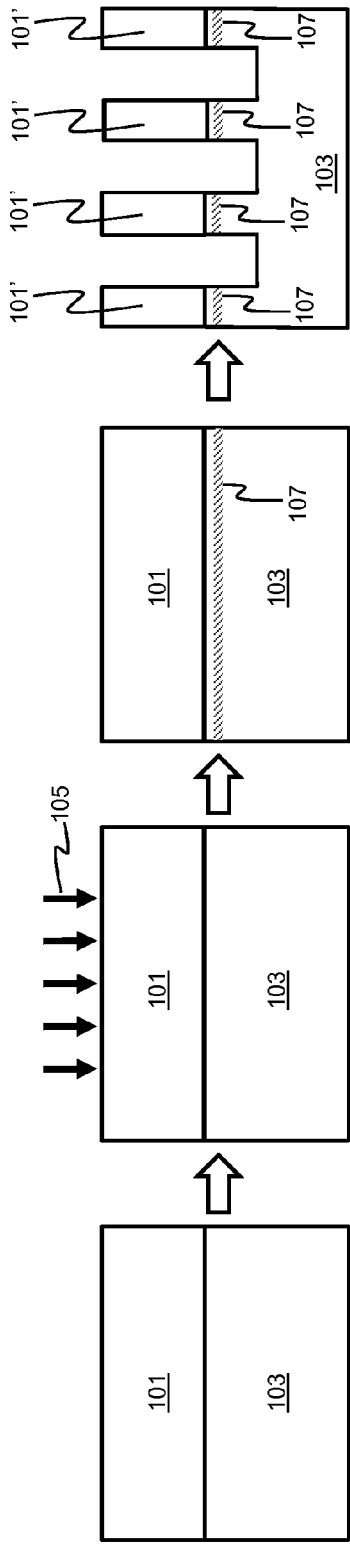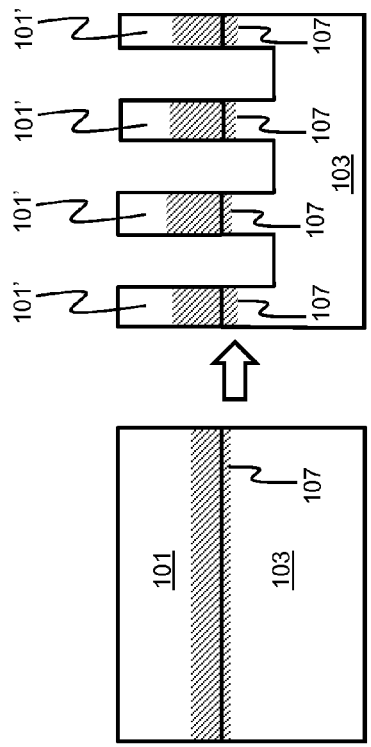

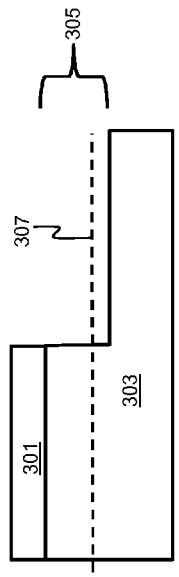
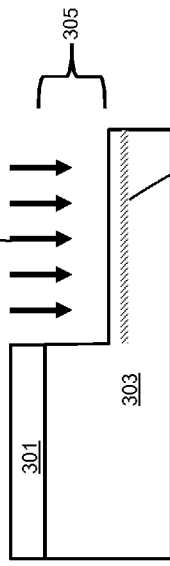
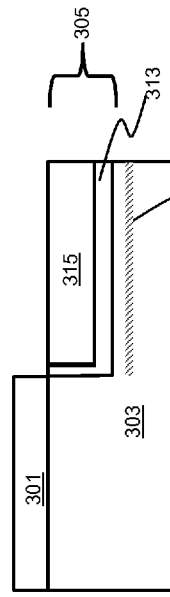
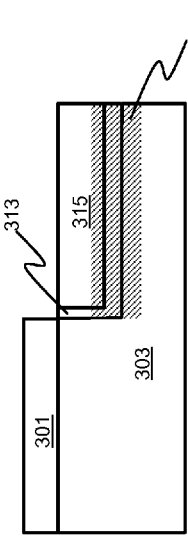
FIG. 3A
FIG. 3B
FIG. 3C
FIG. 3D
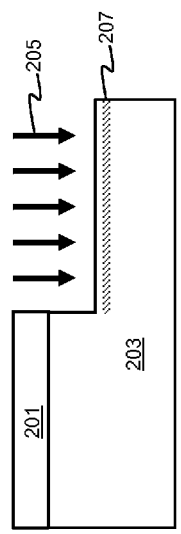
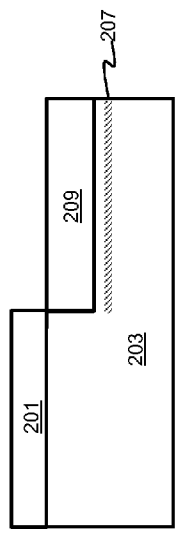
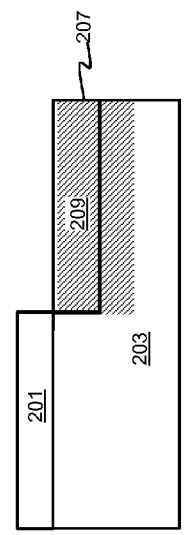
FIG. 2A (Background Art)
FIG. 2B (Background Art)
FIG. 2C (Background Art)
FIG. 2D (Background Art)

EARLY PTS WITH BUFFER FOR CHANNEL DOPING CONTROL

TECHNICAL FIELD

The present disclosure relates to the manufacture of semiconductor devices with isolation structures. The disclosure is particularly applicable to the 10 nanometer (nm) technology node and beyond.

BACKGROUND

For bulk devices, punch through stopper (PTS) doping is often required below an active region to prevent leakage/parasitic channel formation. Ideally, the dopant should be isolated below the active channel layer throughout the flow. A known approach makes use of PTS implants, where the implant is done through the active channel layer. Adverting to FIG. 1A (a two-dimensional (2D) cross-sectional view), an active channel layer 101 is formed on a substrate 103, for example, formed of silicon germanium (SiGe). A PTS implant is then performed through the active channel layer 101, as depicted by the arrows 105 in FIG. 1B. Adverting to FIG. 1C, the active channel layer 101 and the substrate 103 are then annealed to remove any defects and to activate the dopants. The range is set to place the implanted dose 107 below the channel 101 and the fins 101' thereafter, as depicted in FIG. 1D. However, in reality, the implant tail extends into the channel 101, as depicted in FIG. 1E. The dose may further diffuse into the fins 101' with the integration thermal budget, as depicted in FIG. 1F. As a result of the late PTS implant, the doping tail in the fins 101' reduces mobility. In addition, a late PTS implant can relax (or amorphize) the fins 101', which also reduces mobility.

Another known approach includes an early PTS formation via ion implantation (I/I), a doped glass solid phase doping source, or an epitaxially doped process—the goal of each of these is to create a super steep retrograde well (SSRW) where the dopant is intended to remain below the channel layer. FIGS. 2A through 2D schematically illustrate a background process flow for an early PTS implant via I/I, though it is clear that other techniques can be used to introduce dopant prior to channel formation. Adverting to FIG. 2A (a 2D cross-sectional view), a hard-mask 201, for example, formed of silicon nitride (SiN), is formed over a portion of the substrate 203. The substrate 203 is then etched, e.g., to a depth of 40 nm, for subsequent formation of a SiGe channel layer. A low-energy PTS implant is then performed below the surface of the recessed portion of the substrate 203, as depicted by the arrows 205 and the implanted dose or PTS layer 207 of FIG. 2B. The PTS layer 207 is then annealed to activate and recrystallize the layer. Adverting to FIG. 2C, a SiGe channel layer 209 is formed by epitaxial growth on the recessed portion of the substrate 203. Thereafter, the thermal budget, after channel epitaxial growth and shallow trench isolation (STI), diffuses the PTS layer 207 into the channel 209 similar to FIG. 1E, which reduces channel mobility.

A need therefore exists for methodology enabling channel doping control and the resulting bulk device.

SUMMARY

An aspect of the present disclosure is a method of performing an early PTS implant and forming a buffer layer under a bulk or fin channel to control doping in the channel.

Another aspect of the present disclosure is a bulk or fin device having a buffer layer formed below a channel for controlled channel doping.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a recess in a substrate; forming a PTS layer below a bottom surface of the recess; forming a buffer layer on the bottom surface and on side surfaces of the recess; forming a channel layer on and adjacent to the buffer layer; and annealing the channel, buffer, and PTS layers.

Aspects of the present disclosure include the substrate being formed of silicon (Si), SiGe, or a strain relaxed buffer (SRB). Other aspects include forming the recess by: forming a hard-mask over a portion of the substrate; and etching a remaining portion of the substrate without the hard-mask to a depth of 5 nm to 60 nm. Further aspects include forming the PTS layer by: implanting dopants into the bottom surface of the recess; and annealing. Additional aspects include performing a well implant in the bottom surface of the recess after forming the PTS layer, but before forming the buffer layer. Another aspect includes forming the buffer layer of Si, silicon:carbon (Si:C), SiGe, or silicon germanium:carbon (SiGe:C). Other aspects include forming the buffer layer by: epitaxial growth. Further aspects include growing the buffer layer to a thickness of 1 nm to 20 nm. Additional aspects include forming the channel layer of Si, SiGe, or combined group III and group IV elements (III-V). Another aspect includes forming the channel layer by: epitaxial growth. Other aspects include growing the channel layer to a thickness of 1 nm to 100 nm.

Another aspect of the present disclosure is a device including: a substrate having upper and lower surfaces and a recess; a PTS layer and a well formed below a bottom surface of the recess; a buffer layer formed on side and bottom surfaces of the recess; and a channel layer formed on and adjacent to the buffer layer, an upper surface of the channel layer being coplanar with the upper surface of the substrate.

Aspects of the device include the substrate being formed of Si, SiGe, or an SRB. Other aspects include the recess being formed to a depth of 5 nm to 60 nm below the upper surface of the substrate. Further aspects include the buffer layer being formed of Si, Si:C, SiGe, or SiGe:C. Additional aspects include the buffer layer being formed to a thickness of 1 nm to 20 nm. Another aspect includes the channel layer being formed of Si, SiGe, or III-V. Other aspects include the channel layer being formed to a thickness of 1 nm to 100 nm.

A further aspect of the present disclosure is a method including: forming a hard-mask over a portion an upper surface of a substrate formed of Si, SiGe, or an SRB; recessing a remaining portion of the upper surface of the substrate without the hard-mask; performing a PTS implant in a bottom surface of the recess; performing a well implant in the bottom surface of the recess; annealing; growing a buffer layer on the bottom surface and side surfaces of the recess; growing a channel layer on and adjacent to the buffer layer; and annealing the channel, buffer, and PTS layers. Aspects of the present disclosure include forming the buffer layer of Si, Si:C, SiGe, or SiGe:C and the channel layer of Si, SiGe, or III-V.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1F schematically illustrate a background process flow for a late PTS implant via I/I;

FIGS. 2A through 2D schematically illustrate a background process flow for an early PTS implant via I/I or doped glass; and FIGS. 3A through 3D schematically illustrate a process flow for an early PTS formation via I/I or doped glass with a buffer, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of dopants diffusing into the active/channel region during integration thermal budget attendant upon forming a bulk or fin device.

Methodology in accordance with embodiments of the present disclosure includes forming a recess in a substrate. A PTS layer is formed below a bottom surface of the recess. A buffer layer is formed on the bottom surface and on side surfaces of the recess. A channel layer is formed on and adjacent to the buffer layer and the channel, buffer, and PTS layers are annealed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 3A through 3D schematically illustrate a process flow for an early PTS formation via I/I or doped glass with a buffer, in accordance with an exemplary embodiment. Similar to the process of FIG. 2A, a hard-mask 301, for example, formed of SiN, is formed over a portion of the substrate 303, as depicted in FIG. 3A (a 2D cross-sectional view). The substrate 303 may be formed, for example, of Si, SiGe, or an SRB. However, in contrast to FIG. 2A, the substrate 303 is etched to a greater depth of 5 nm to 60 nm forming a recess 305. The greater depth of the recess 305 relative to FIG. 2A is depicted by the dashed line 307.

Similar to FIG. 2B, a low-energy PTS implant is performed into the substrate 303 below the surface of the recess 305, as depicted by the arrows 309 and the implanted dopants or PTS layer 311 of FIG. 3B. The PTS implant may be performed, for example, with dopants such as phosphorous (P), arsenic (As), or antimony (Sb) for n-doping of a Si substrate 303 and with dopants such as boron (B) or gallium (Ga) for p-doping of a Si substrate 303. Further, the PTS implant may be performed, for example, at doping ranges from 5E17 atoms per cubic centimeter ($cm^{-3}$) to 5E19 $cm^{-3}$. A well implant (not shown for illustrative convenience) is also performed into the substrate 303 below the surface of the recess 305. The well implant may be performed, for example, with dopants such as B for a p-type well (p-well) and with dopants such as As or P for a n-type well (n-well). Further, the well implant may be performed at doping ranges from 1E17 $cm^{-3}$ to 1E19 $cm^{-3}$ and at a depth of 100 nm to 300 nm. Alternatively, the PTS layer 311 and well dopants may be introduced into the substrate 303 below the surface of the recess 305 by epitaxial growth, plasma, solid-phase synthesis, or other similar sources. The PTS layer 311 (and well dopants) is then annealed to remove any defects and activate the dopants. The PTS layer 311 (and well dopants) may be annealed, for example, at a temperature of 800° C. to 1250° C. for 100 nanosecond (ns) to 30 second (s).

Adverting to FIG. 3C, a buffer layer 313 is formed on the bottom surface and side surfaces of the recess 305. The buffer layer 313 is formed, for example, by epitaxial growth. The buffer layer 313 may be formed, for example, of Si, Si:C, SiGe, or SiGe:C. Further, the buffer layer 313 may be formed, for example, to a thickness of 1 nm to 20 nm. A channel layer 315 is then formed on and adjacent to the buffer layer 313. The channel layer 315 is also formed, for example, by epitaxial growth. The channel layer 315 may be formed, for example, of Si, SiGe, or III-V. Further, the channel layer 315 may be formed, for example, to a thickness of 1 nm to 100 nm. Consequently, the upper surface of the channel layer 315 is coplanar with the upper surface of the substrate 303. Thereafter, the channel layer 315, the buffer layer 313, and the PTS layer 311 are annealed by a standard thermal budget for integration scheme including, e.g., hard-mask, STI, spacer, replacement metal gate (RMG), and source/drain activation. The specific thermal budget depends on the whole flow and both time and temperature are critical for dopant diffusion. However, in contrast to FIGS. 1E and 2D, the buffer layer 313 helps to prevent severe diffusion of the PTS layer 311 into the channel layer 315, resulting in a high mobility channel layer 315.

The embodiments of the present disclosure can achieve several technical effects including enabling tailored diffusion control by careful material selection; enabling the formation of true un-doped bulk or fin channels; only requiring modification of existing processes; and being compatible with all epitaxial channel schemes including SRB. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices in the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a recess in a substrate;
forming a punch through stopper (PTS) layer directly below and aligned with a bottom surface of the recess;
forming a buffer layer on the bottom surface and directly on side surfaces of the recess, with no material between the buffer layer and the side surfaces of the recess, wherein the portion of the buffer layer formed on the bottom surface of the recess is formed directly above and aligned with the PTS layer;
forming a channel layer on and adjacent to the buffer layer; and
annealing the channel, buffer, and PTS layers.

2. The method according to claim 1, wherein the substrate comprises silicon (Si), silicon germanium (SiGe), or a strain relaxed buffer (SRB).

3. The method according to claim 1, comprising forming the recess by:
forming a hard-mask over a portion of the substrate; and
etching a remaining portion of the substrate without the hard-mask to a depth of 5 nanometer (nm) to 60 nm.

4. The method according to claim 1, comprising forming the PTS layer by:
implanting a dopant into the bottom surface of the recess; and
annealing.

5. The method according to claim 1, further comprising performing a well implant in the bottom surface of the recess after forming the PTS layer, but before forming the buffer layer.

6. The method according to claim 1, comprising forming the buffer layer of Si, silicon:carbon (Si:C), SiGe, or silicon germanium:carbon (SiGe:C).

7. The method according to claim 6, comprising forming the buffer layer by:
epitaxial growth.

8. The method according to claim 7, comprising growing the buffer layer to a thickness of 1 nm to 20 nm.

9. The method according to claim 1, comprising forming the channel layer of Si, SiGe, or combined group III and group IV elements (III-V).

10. The method according to claim 9, comprising forming the channel layer by:
epitaxial growth.

11. The method according to claim 10, comprising growing the channel layer to a thickness of 1 nm to 100 nm.

12. A device comprising:
a substrate having upper and lower surfaces and a recess;
a punch through stopper (PTS) layer and a well formed directly below and aligned with a bottom surface of the recess;
a buffer layer formed directly on side and bottom surfaces of the recess, with no material between the buffer layer and the side surfaces of the recess, wherein the portions of the buffer layer on the bottom surfaces of the recess is formed directly above and aligned with the PTS layer; and
a channel layer formed on and adjacent to the buffer layer, an upper surface of the channel layer is coplanar with the upper surface of the substrate.

13. The device according to claim 12, wherein the substrate comprises silicon (Si), silicon germanium (SiGe), or a strain relaxed buffer (SRB).

14. The device according to claim 12, wherein the recess is formed to a depth of 5 nanometer (nm) to 60 nm below the upper surface of the substrate.

15. The device according to claim 12, wherein the buffer layer comprises Si, silicon/carbon (Si/C), or SiGe.

16. The device according to claim 12, wherein the buffer layer is formed to a thickness of 1 nanometer (nm) to 20 nm.

17. The device according to claim 12, wherein the channel layer comprises Si, SiGe, combined group III and group IV elements (III-V).

18. The device according to claim 12, wherein the channel layer is formed to a thickness of 1 nm to 100 nm.

19. A method comprising:
forming a hard-mask over a portion an upper surface of a substrate comprising silicon (Si), silicon germanium (SiGe), or a strain relaxed buffer (SRB);
recessing a remaining portion of the upper surface of the substrate without the hard-mask;
performing a punch through stopper (PTS) implant in a bottom surface of the recess to form a PTS layer directly below and aligned with the bottom surface of the recess;
performing a well implant in the bottom surface of the recess;
annealing;
growing a buffer layer directly on the bottom surface and side surfaces of the recess, with no material between the buffer layer and the side surfaces of the recess, wherein the portion of the buffer layer on the bottom surface of the recess is formed directly above and aligned with the PTS layer;
growing a channel layer on and adjacent to the buffer layer; and
annealing the channel, buffer, and PTS layers.

20. The method according to claim 19, comprising forming the buffer layer of Si, silicon:carbon (Si:C), SiGe, silicon germanium:carbon (SiGe:C) and the channel layer of Si, SiGe, or combined group III and group IV elements (III-V).

* * * * *

UNITED STATES PATENT AND TRADEMARK OFFICE
CERTIFICATE OF CORRECTION

PATENT NO. : 9,647,086 B2  
APPLICATION NO. : 14/826803  
DATED : May 9, 2017  
INVENTOR(S) : Steven Bentley et al.

Page 1 of 1

It is certified that error appears in the above-identified patent and that said Letters Patent is hereby corrected as shown below:

On the Title Page

Item (73), the Assignees information which reads:  
"(73) Assignees:  
GLOBALFOUNDRIES, INC., Grand Cayman (KY);  
INTERNATIONAL BUSINESS MACHINES CORPORATION, Armonk, NY (US)"

Should read:  
"(73) Assignees:  
GLOBALFOUNDRIES, INC., Grand Cayman (KY);  
INTERNATIONAL BUSINESS MACHINES CORPORATION, Armonk, NY (US);  
STMicroelectronics, INC., Coppell, TX (US)"

Signed and Sealed this  
Second Day of January, 2018

Joseph Matal  
*Performing the Functions and Duties of the*  
*Under Secretary of Commerce for Intellectual Property and*  
*Director of the United States Patent and Trademark Office*